United States Patent
Takamine (10) Patent No.: US 10,812,043 B2
(45) Date of Patent: Oct. 20, 2020

(54) ACOUSTIC WAVE FILTER DEVICE (71) Applicant: Murata Manufacturing Co., Ltd., Nagaokakyo-shi, Kyoto-fu (JP)

(72) Inventor: Yuichi Takamine, Nagaokakyo (JP)

(73) Assignee: MURATA MANUFACTURING CO., LTD., Kyoto (JP)

(*) Notice: Subject to any disclaimer, the term of this patent is extended or adjusted under 35 U.S.C. 154(b) by 0 days.

(21) Appl. No.: 16/374,765

(22) Filed: Apr. 4, 2019

(65) Prior Publication Data
US 2019/0238116 A1  Aug. 1, 2019

Related U.S. Application Data (63) Continuation of application No. PCT/JP2017/035498, filed on Sep. 29, 2017.

(30) Foreign Application Priority Data

Oct. 13, 2016 (JP) ................... 2016-201710

(51) Int. Cl.
*H03H 9/145* (2006.01)
*H03H 9/72* (2006.01)
(Continued)

(52) U.S. Cl.
CPC ........ *H03H 9/1457* (2013.01); *H03H 7/0161* (2013.01); *H03H 9/02574* (2013.01);
(Continued)

(58) Field of Classification Search
CPC .... H03H 9/725; H03H 9/1457; H03H 9/6483; H03H 9/6436; H03H 9/02637;
(Continued)

(56) References Cited

U.S. PATENT DOCUMENTS 5,874,869 A   2/1999  Ueda et al.
2005/0190014 A1  9/2005  Saitou et al.
(Continued)

FOREIGN PATENT DOCUMENTS

JP   10-41704 A   2/1998
JP   10-163803 A  6/1998
(Continued)

OTHER PUBLICATIONS

Official Communication issued in corresponding Japanese Patent Application No. 2018-544960, dated Jan. 21, 2020.
(Continued)

*Primary Examiner* — Robert J Pascal
*Assistant Examiner* — Jorge L Salazar, Jr.
(74) *Attorney, Agent, or Firm* — Keating & Bennett, LLP (57) ABSTRACT

An acoustic wave filter device includes a first band pass filter including a first acoustic wave resonator connected between an antenna terminal and a first signal terminal and having a first pass band, and a second band pass filter connected with the antenna terminal and having a second pass band on a higher side of the first pass band. The first acoustic wave resonator includes a substrate on a surface of which a piezoelectric thin film is provided, an IDT electrode provided on the substrate, and reflectors. At least a pitch of some electrode fingers is different from a pitch of other electrode fingers in at least one of the IDT electrode and the reflectors of the first acoustic wave resonator on a side closest to the antenna terminal.

20 Claims, 7 Drawing Sheets (51) Int. Cl.
*H03H 9/64* (2006.01)
*H04B 1/00* (2006.01)
*H03H 7/01* (2006.01)
*H03H 9/54* (2006.01)
*H03H 9/02* (2006.01)

(52) U.S. Cl.
CPC .... *H03H 9/02637* (2013.01); *H03H 9/14576* (2013.01); *H03H 9/54* (2013.01); *H03H 9/64* (2013.01); *H03H 9/6436* (2013.01); *H03H 9/6483* (2013.01); *H03H 9/725* (2013.01); *H04B 1/0057* (2013.01)

(58) Field of Classification Search
CPC .. H03H 9/14576; H03H 9/02574; H03H 9/64; H03H 7/0161; H03H 9/54; H03H 7/46; H03H 9/14538; H03H 9/72; H04B 1/0057
USPC .......................................... 333/133, 193–196
See application file for complete search history.

(56) References Cited

U.S. PATENT DOCUMENTS

| | | | |
|---|---|---|---|
| 2007/0080756 A1* | 4/2007 | Aigner | H03H 9/706 333/133 |
| 2008/0150652 A1 | 6/2008 | Itou | |
| 2011/0187479 A1 | 8/2011 | Takamine | |
| 2015/0295697 A1 | 10/2015 | Kawachi et al. | |
| 2016/0036415 A1* | 2/2016 | Ikeuchi | H03H 9/02834 333/133 |
| 2017/0222624 A1 | 8/2017 | Kishino | |
| 2017/0244431 A1* | 8/2017 | Araki | H04J 1/045 |
| 2017/0359051 A1 | 12/2017 | Urata | |

FOREIGN PATENT DOCUMENTS

| | | |
|---|---|---|
| JP | 2005-244669 A | 9/2005 |
| JP | 2005-295203 A | 10/2005 |
| JP | 2008-160562 A | 7/2008 |
| JP | 2012-028896 A | 2/2012 |
| JP | 2015-201808 A | 11/2015 |
| WO | 2010/061496 A1 | 6/2010 |
| WO | 2016/017730 A1 | 2/2016 |
| WO | 2016/104598 A1 | 6/2016 |

OTHER PUBLICATIONS

Official Communication issued in International Patent Application No. PCT/JP2017/035498, dated Oct. 31, 2017.

* cited by examiner

ACOUSTIC WAVE FILTER DEVICE

CROSS REFERENCE TO RELATED APPLICATIONS

This application claims the benefit of priority to Japanese Patent Application No. 2016-201710 filed on Oct. 13, 2016 and is a Continuation Application of PCT Application No. PCT/JP2017/035498 filed on Sep. 29, 2017. The entire contents of each application are hereby incorporated herein by reference.

BACKGROUND OF THE INVENTION

1. Field of the Invention

The present invention relates to an acoustic wave filter device including band pass filters.

2. Description of the Related Art

An acoustic wave filter device has been widely used as a filter of a cellular phone or the like. In an acoustic wave filter device described in Japanese Unexamined Patent Application Publication No. 2012-028896, surface acoustic wave filters are connected in common on an antenna terminal side. The surface acoustic wave filters are band pass filters.

In a conventional surface acoustic wave filter, a ripple often occurs in a stop band on a higher frequency side of a resonant frequency. When surface acoustic wave filters are connected in common, due to influence of a ripple occurring in a surface acoustic wave filter, a ripple may occur in a pass band of another surface acoustic wave filter connected in common with the surface acoustic wave filter as well. Thus, in the acoustic wave filter device described in Japanese Unexamined Patent Application Publication No. 2012-028896, insertion loss of the surface acoustic wave filter connected in common may be deteriorated.

SUMMARY OF THE INVENTION

Preferred embodiments of the present invention provide acoustic wave filter devices each capable of reducing a ripple in a stop band on a higher side of a pass band of a band pass filter, and reducing or preventing deterioration in insertion loss of another band pass filter connected in common with the band pass filter.

An acoustic wave filter device according to a preferred embodiment of the present invention includes an antenna terminal connected with an antenna, a first signal terminal electrically connected with the antenna terminal, a second signal terminal electrically connected with the antenna terminal, a first band pass filter including at least one first acoustic wave resonator connected between the antenna terminal and the first signal terminal, and having a first pass band, and a second band pass filter connected between the antenna terminal and the second signal terminal, and having a second pass band on a higher side of the first pass band, in which the first band pass filter includes a substrate, at least a portion of which has piezoelectricity, the first acoustic wave resonator includes an InterDigitated Transducer (IDT) electrode provided on the substrate and reflectors disposed on both sides of the IDT electrode in an acoustic wave propagation direction, and a pitch of at least some electrode fingers is different from a pitch of other electrode fingers in at least one of the IDT electrode and the reflectors of the first acoustic wave resonator disposed on a side closest to the antenna terminal.

In a specific preferred embodiment of the acoustic wave filter device according to the present invention, a pitch of at least some electrode fingers is different from a pitch of other electrode fingers in the IDT electrode.

In another specific preferred embodiment of the acoustic wave filter device according to the present invention, a pitch of electrode fingers in the reflectors is different from an average value of pitches of electrode fingers in the IDT electrode.

In still another specific preferred embodiment of the acoustic wave filter device according to the present invention, a pitch of at least some electrode fingers is different from a pitch of other electrode fingers in the reflector. In this case, it is possible to further reduce a ripple in a stop band on a higher side of a first pass band of the first band pass filter, and it is possible to further reduce or prevent deterioration in insertion loss of the second band pass filter.

In another specific preferred embodiment of the acoustic wave filter device according to the present invention, distance between the IDT electrode and the reflector is shorter than about 0.5 times an average value of wave lengths defined by pitches of electrode fingers in the IDT electrode. In this case, it is possible to further reduce a ripple in a stop band on a higher side of a first pass band of the first band pass filter, and it is possible to further reduce or prevent deterioration in insertion loss of a second band pass filter.

In yet another specific preferred embodiment of the acoustic wave filter device according to the present invention, the first band pass filter includes a second acoustic wave resonator connected between a ground potential and a series arm connecting the antenna terminal and the first signal terminal. The second acoustic wave resonator is disposed on a side closer to the first signal terminal than the first acoustic wave resonator disposed on a side closest to the antenna terminal.

In yet another specific preferred embodiment of the acoustic wave filter device according to the present invention, the first band pass filter includes a second acoustic wave resonator connected between a ground potential and a series arm connecting the antenna terminal and the first signal terminal. The second acoustic wave resonator is disposed on a side closer to the antenna terminal than the first acoustic wave resonator disposed on a side closest to the antenna terminal.

In still another specific preferred embodiment of the acoustic wave filter device according to the present invention, the first band pass filter is a ladder filter, the first acoustic wave resonator is a series arm resonator, and the second acoustic wave resonator is a parallel arm resonator.

In still another specific preferred embodiment of the acoustic wave filter device according to the present invention, the first band pass filter further includes a longitudinally coupled resonator acoustic wave filter connected between the antenna terminal and the first signal terminal, and the first pass band is defined by the longitudinally coupled resonator acoustic wave filter.

In still another specific preferred embodiment of the acoustic wave filter device according to the present invention, at least one band pass filter, other than the first and second band pass filters, connected with the antenna terminal, is further included.

According to preferred embodiments of the present invention, it is possible to provide acoustic wave filter devices that each reduce a ripple in a stop band on a higher side of a pass band of a band pass filter, and reduce or prevent deterioration in insertion loss of another band pass filter connected in common with the band pass filter.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Hereinafter, specific preferred embodiments of the present invention will be described with reference to the accompanying drawings, to clarify the present invention.

It should be noted that each of the preferred embodiments described herein is exemplary and that partial replacement or combination of the configurations is possible between different preferred embodiments.

Figure 1:
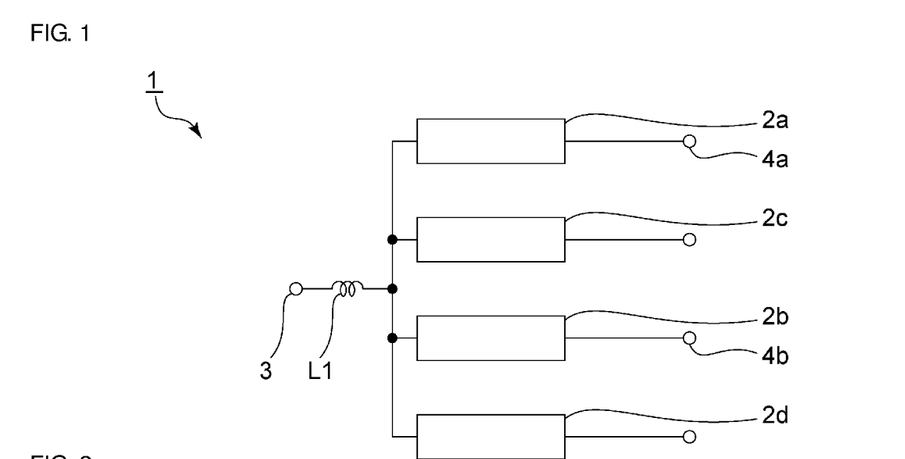
FIG. 1 is a schematic circuit diagram of an acoustic wave filter device according to a first preferred embodiment of the present invention.

FIG. 1 is a schematic circuit diagram of an acoustic wave filter device according to a first preferred embodiment of the present invention.

An acoustic wave filter device 1 preferably includes an antenna terminal 3 connected with an antenna, and first and second signal terminals 4a and 4b electrically connected with the antenna terminal 3. The acoustic wave filter device 1 includes first to fourth band pass filters 2a to 2d connected in common with the antenna terminal 3. The first band pass filter 2a is connected between the antenna terminal 3 and the first signal terminal 4a, and the second band pass filter 2b is connected between the antenna terminal 3 and the second signal terminal 4b.

In the present preferred embodiment, an impedance matching inductor L1 is preferably connected to a node between the first to fourth band pass filters 2a to 2d and the antenna terminal 3. Note that, the inductor L1 is not necessarily provided.

The first to fourth band pass filters 2a to 2d respectively have first to fourth pass bands that are different from each other. The first pass band is a transmission band of Band 3, and is equal to or higher than about 1710 MHz and equal to or lower than about 1785 MHz. The second pass band is a transmission band of Band 1 on a higher side of the first pass band, and is equal to or higher than about 1920 MHz and equal to or lower than about 1980 MHz. The third pass band is a reception band of Band 3, and is equal to or higher than about 1805 MHz and equal to or lower than about 1880 MHz. The fourth pass band is a reception band of Band 1, and is equal to or higher than about 2110 MHz and equal to or lower than about 2170 MHz. Note that, the first to fourth pass bands are not limited to the above-described pass bands, and it is sufficient that the second pass band be provided on or above a higher end of the first pass band.

Figure 2:
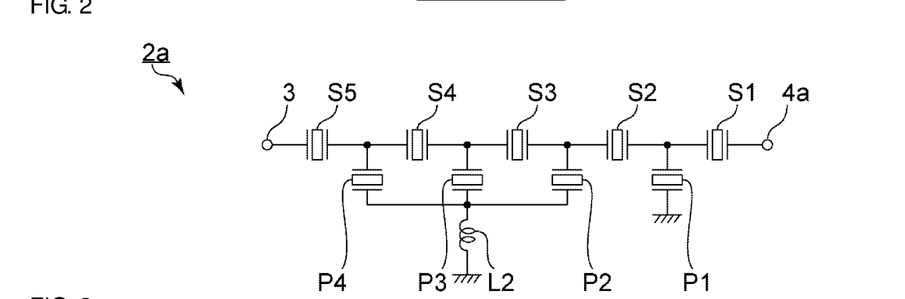
FIG. 2 is a circuit diagram of a first band pass filter in the first preferred embodiment of the present invention.

FIG. 2 is a circuit diagram of the first band pass filter in the first preferred embodiment.

In the present preferred embodiment, the first band pass filter 2a preferably is a ladder filter including series arm resonators S1 to S5 and parallel arm resonators P1 to P4. The series arm resonators S1 to S5 are preferably first acoustic wave resonators in the present invention. The parallel arm resonators P1 to P4 are preferably second acoustic wave resonators in the present invention.

The series arm resonators S1 to S5 are connected with each other in series between the antenna terminal 3 and the first signal terminal 4a. The series arm resonator S5 is a series arm resonator disposed on a side closest to the antenna terminal 3.

Each of the parallel arm resonators P1 to P4 is connected between a ground potential and a series arm connecting the antenna terminal 3 and the first signal terminal 4a. More specifically, the parallel arm resonator P1 is connected between the ground potential and a node between the series arm resonator S1 and the series arm resonator S2. The parallel arm resonator P2 is connected between the ground potential and a node between the series arm resonator S2 and the series arm resonator S3. The parallel arm resonator P3 is connected between the ground potential and a node between the series arm resonator S3 and the series arm resonator S4. The parallel arm resonator P4 is connected between the ground potential and a node between the series arm resonator S4 and the series arm resonator S5.

The first band pass filter 2a includes an inductor L2 connected with a ground potential side of the parallel arm resonators P2 to P4. The inductor L2 is connected between the ground potential and the parallel arm resonators P2 to P4.

Note that, it is sufficient that the first band pass filter 2a includes a first acoustic wave resonator disposed on a side closest to the antenna terminal 3, and the first band pass filter 2a is not limited to the above-described circuit configuration. There is no particular limitation on a circuit configuration of each of the second to fourth band pass filters.

A feature of the present preferred embodiment is a configuration of an IDT electrode described later in the series arm resonator S5. Hereinafter, a more specific configuration of the first band pass filter 2a and the series arm resonator S5 will be described.

Figure 3:
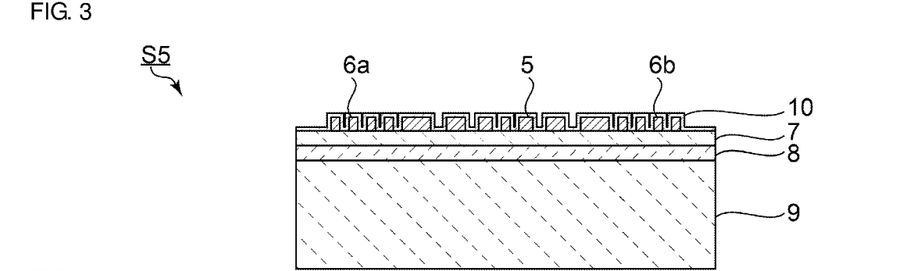
FIG. 3 is a schematic elevational sectional view of a series arm resonator, in the first band pass filter, disposed on a side closest to an antenna terminal in the first preferred embodiment of the present invention.

FIG. 3 is a schematic elevational sectional view of a series arm resonator, in the first band pass filter, disposed on a side closest to an antenna terminal in the first preferred embodiment.

The first band pass filter preferably includes a substrate at least a portion of which has piezoelectricity. In the present preferred embodiment, the substrate includes a piezoelectric thin film 7 on a surface thereof, and includes a laminate including a low acoustic velocity film 8 in which an acoustic velocity of a propagating bulk wave is slower than an acoustic velocity of an acoustic wave propagating in the piezoelectric thin film 7, a support substrate 9 in which an acoustic velocity of a propagating bulk wave is faster than an acoustic velocity of an acoustic wave propagating in the piezoelectric thin film 7, and the like. The piezoelectric thin film 7 is preferably made of LiTaO$_3$ having a cut angle of 50°, for example. Note that, the cut angle and a material of the piezoelectric thin film 7 are not limited to those described above. The piezoelectric thin film 7 may be made of a piezoelectric single crystal other than LiTaO$_3$ such as, for example, LiNbO$_3$ or the like, or may be made of suitable piezoelectric ceramics.

The low acoustic velocity film 8 is preferably made of silicon oxide. Note that, it is sufficient that the low acoustic velocity film 8 is made of a material in which an acoustic velocity is relatively low, and is made of, for example, a material containing as a main component a compound obtained by adding, for example, fluorine, carbon, or boron to tantalum oxide, silicon oxynitride, or glass.

The support substrate 9 is made of Si. Note that, it is sufficient that the support substrate 9 is made of a material in which an acoustic velocity is relatively high, and is made of, for example, a material containing, as a main component, diamond, a DLC film, silicon oxynitride, silicon carbide, aluminum oxide, aluminum nitride, or the like.

As described above, with a configuration in which the piezoelectric thin film 7, the low acoustic velocity film 8, and the support substrate 9 made of a high acoustic velocity material are laminated, it is possible to effectively confine energy of an acoustic wave. In addition, a whole of the substrate may have piezoelectricity. In this case, the substrate is a piezoelectric thin film consisting of a single piezoelectric body layer, for example.

An IDT electrode 5 is provided on the piezoelectric thin film 7. By applying an AC voltage to the IDT electrode 5, an acoustic wave is excited. Reflectors 6a and 6b are provided on both sides of the IDT electrode 5 in an acoustic wave propagation direction, respectively. In this way, the series arm resonator S5 is provided.

The IDT electrode 5 and the reflectors 6a and 6b are preferably made of a laminated metal film in which metal layers are laminated. More specifically, each of the IDT electrode 5 and the reflectors 6a and 6b preferably includes a Ti layer provided on the piezoelectric thin film 7, and an AlCu layer provided on the Ti layer. In the present preferred embodiment, the AlCu layer is preferably an alloy containing about 1% by weight of Cu in Al. Note that, the IDT electrode 5 and the reflectors 6a and 6b may be made of an appropriate metal other than those described above, or may be made of a single layer of a metal film. The IDT electrode 5 and the reflectors 6a and 6b may be made of materials different from each other.

A dielectric film 10 is provided on the piezoelectric thin film 7 so as to cover the IDT electrode 5 and the reflectors 6a and 6b. Although not particularly limited, the dielectric film 10 is preferably made of SiO$_2$. The dielectric film 10 defines and functions as a protective film, for example. Note that, the dielectric film 10 is not necessarily provided.

Thicknesses of each layer in the first band pass filter are preferably as follows. The thickness of the Ti layer of the IDT electrode 5 is about 2 nm, and the thickness of the AlCu layer is about 162 nm, for example. The thickness of the dielectric film 10 is about 25 nm, for example. Thickness of the piezoelectric thin film 7 is about 600 nm. The thickness of the low acoustic velocity film 8 is about 670 nm, for example. The thickness of the support substrate 9 is about 125 μm, for example. Note that the thickness of each layer is not limited to the above.

Figure 4:
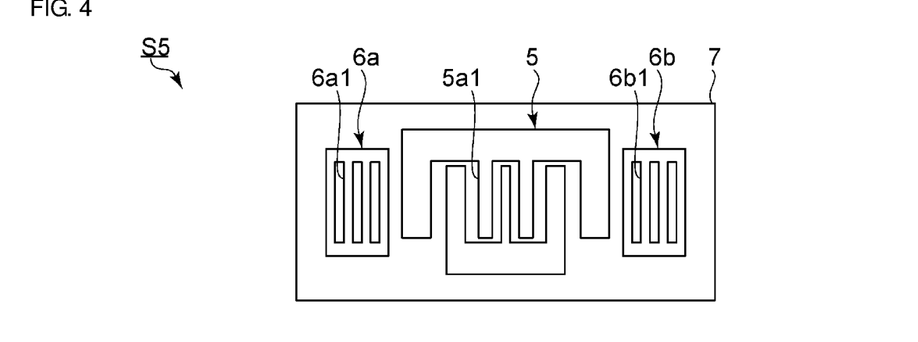
FIG. 4 is a schematic plan view illustrating an electrode configuration of the series arm resonator, in the first band pass filter, disposed on the side closest to the antenna terminal in the first preferred embodiment of the present invention.

FIG. 4 is a schematic plan view illustrating an electrode configuration of the series arm resonator, in the first band pass filter, disposed on the side closest to the antenna terminal in the first preferred embodiment. In FIG. 4, the dielectric film is omitted. This is also true in each of schematic plan views described later.

The IDT electrode 5 includes electrode fingers 5a1. In the series arm resonator S5, a pitch of electrode fingers in the IDT electrode 5 increases toward an outer side in the acoustic wave propagation direction. More specifically, a pitch of electrode fingers at a center in the acoustic wave propagation direction is preferably about 1.07 μm, and a pitch of electrode fingers at an outermost side in the acoustic wave propagation direction is preferably about 1.072 μm, for example. An average value of the pitches of electrode fingers in the IDT electrode 5 is preferably about 1.071 μm, for example. On the other hand, the reflectors 6a and 6b also have electrode fingers 6a1 and electrode fingers 6b1, respectively. A pitch of electrode fingers in the reflectors 6a and 6b is constant, and is preferably about 1.071 μm, for example. In this way, the pitch of electrode fingers in the reflectors 6a and 6b is equal to the average value of the pitches of electrode fingers in the IDT electrode 5. Distance between the reflector 6a and the IDT electrode 5 and distance between the reflector 6b and the IDT electrode 5 are also the same as the average value of the pitches of electrode fingers in the IDT electrode 5.

On the other hand, duty ratios of the IDT electrode 5 and the reflectors 6a and 6b are constant in the present preferred embodiment. Note that, the duty ratios of the IDT electrode 5 and the reflectors 6a and 6b are not necessarily constant.

The series arm resonators S1 to S4 and the parallel arm resonators P1 to P4 illustrated in FIG. 2 also have the same configuration as that of the series arm resonator S5 except for the pitch of electrode fingers in the IDT electrode. Desired parameters for each of the acoustic wave resonators are shown in Table 1 below. Here, when an IDT electrode is viewed from an acoustic wave propagation direction, a dimension of a region in which adjacent electrode fingers overlap each other along a direction of electrode fingers extending is defined as an intersecting width. A wave length in Table 1 is a wave length defined by a pitch of electrode fingers in an IDT electrode or a reflector. Distance between an IDT electrode and a reflector is a value normalized by a wave length λ, where λ is a wave length of the IDT electrode. Note that, the distance between the IDT electrode and the reflector is a distance between a center of an electrode finger, in the IDT electrode, closest to the reflector, and a center of an electrode finger, in the reflector, closest to the IDT electrode.

electrode fingers in the IDT electrode 5 of the series arm resonator S5 disposed on a side closest to the antenna terminal. Thus, it is possible to reduce a ripple of a stop band on a higher side of a first pass band of the first band pass filter, and to reduce or prevent deterioration in insertion loss of the second band pass filter connected in common with the first band pass filter. This will be described below by comparing the present preferred embodiment with a comparative example.

An acoustic wave filter device of the comparative example has the same configuration as that of the acoustic wave filter device of the first preferred embodiment, except that a pitch of electrode fingers in an IDT electrode of a series arm resonator disposed on a side closest to an antenna terminal is 1.071 μm and constant. Note that, the pitch of electrode fingers in the IDT electrode of the above series arm resonator of the comparative example is the same as the average value of the pitches of electrode fingers in the IDT electrode of the series arm resonator disposed on the side closest to the antenna in the first preferred embodiment.

Figure 5:
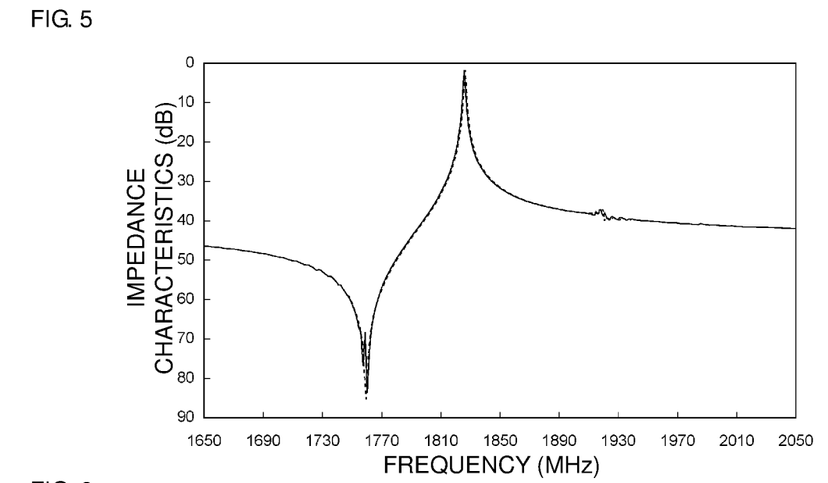
FIG. 5 is a graph illustrating impedance frequency characteristics of the series arm resonator, in the first band pass filter, disposed on the side closest to the antenna terminal in the first preferred embodiment of the present invention and a comparative example.
Figure 6:
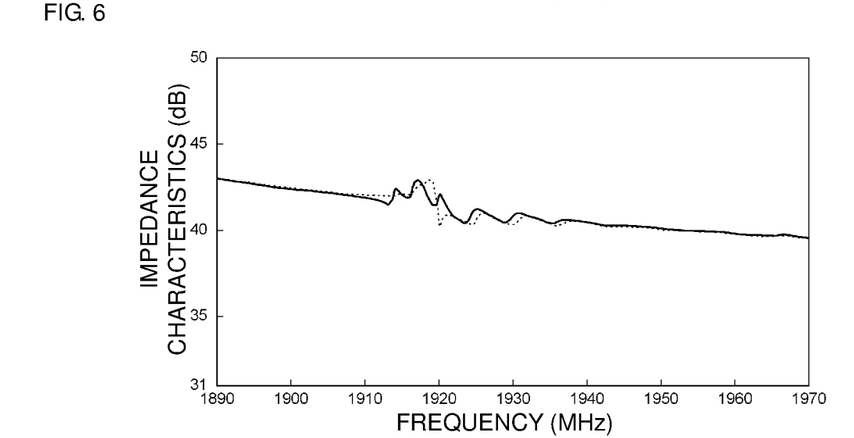
FIG. 6 is an enlarged view of a portion of FIG. 5.
Figure 7:
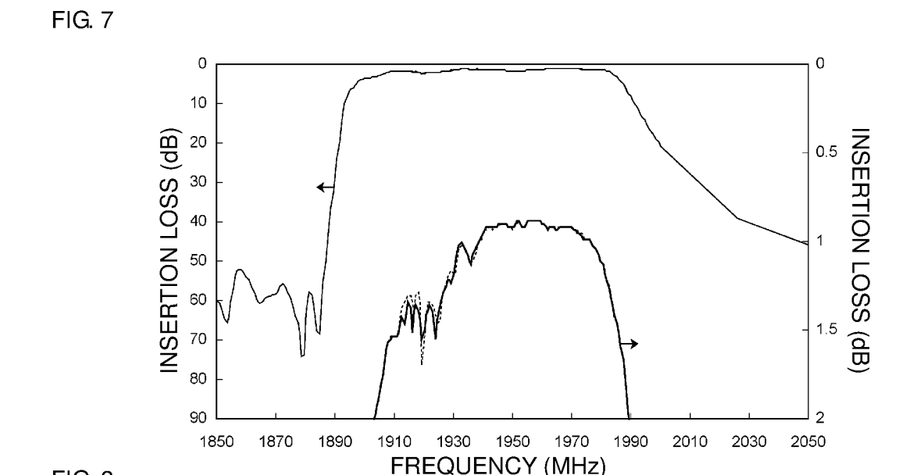
FIG. 7 is a graph illustrating attenuation frequency characteristics of a second band pass filter in the first preferred embodiment and the comparative example of the present invention.

FIG. 5 is a graph illustrating impedance frequency characteristics of the series arm resonator, in the first band pass filter, disposed on the side closest to the antenna terminal in the first preferred embodiment and the comparative example. FIG. 6 is an enlarged view of FIG. 5. FIG. 7 is a graph illustrating attenuation frequency characteristics of

TABLE 1

| | S1 | P1 | S2 | P2 | S3 | P3 | S4 | P4 | S5 |
|---|---|---|---|---|---|---|---|---|---|
| WAVE LENGTH OF IDT ELECTRODE (μm) | 2.145 | 2.251 | 2.169 | 2.251 | 2.165 | 2.240 | 2.168 | 2.251 | 2.144 TO 2.140 |
| WAVE LENGTH OF REFLECTOR (μm) | 2.145 | 2.251 | 2.169 | 2.251 | 2.165 | 2.240 | 2.168 | 2.251 | 2.142 |
| INTERSECTING WIDTH (μm) | 18.7 | 80 | 20.1 | 82 | 18 | 32.8 | 33 | 48.8 | 17.6 |
| NUMBER OF PAIRS OF ELECTRODE FINGERS IN IDT ELECTRODE (PAIRS) | 140 | 60 | 190 | 38 | 128 | 108 | 107 | 113 | 150 |
| NUMBER OF ELECTRODE FINGERS IN REFLECTOR (FINGERS) | 21 | 21 | 21 | 21 | 21 | 21 | 21 | 21 | 21 |
| DISTANCE BETWEEN IDT ELECTRODE AND REFLECTOR (λ) | 0.5 | 0.5 | 0.5 | 0.5 | 0.5 | 0.5 | 0.5 | 0.5 | 0.5 |
| DUTY | 0.5 | 0.5 | 0.5 | 0.5 | 0.5 | 0.5 | 0.5 | 0.5 | 0.5 |

Note that, each of the pitches of electrode fingers and duty ratios is not limited to the value shown in Table 1, and may be determined according to desired filter characteristics.

In the present preferred embodiment, the third band pass filter 2c illustrated in FIG. 1 is provided on the same substrate as the first band pass filter 2a. On the other hand, the second and fourth band pass filters 2b and 2d are provided on a substrate different from the substrate on which the first and third band pass filters 2a and 2c are configured. The second and fourth band pass filters 2b and 2d are preferably provided on a substrate including a piezoelectric thin film made of LiTaO$_3$ having a cut angle of about 42° or more and about 45° or less on a surface thereof, for example.

Note that, there is no particular limitation on respective configurations of the second to fourth band pass filters 2b to 2d. For example, the first to fourth band pass filters 2a to 2d may be provided on the same substrate, or may be provided on different substrates respectively.

Referring again to FIG. 4, one of the unique features of the present preferred embodiment is that a pitch of at least some electrode fingers is different from a pitch of other the second band pass filter in the first preferred embodiment and the comparative example. In each of FIG. 5 to FIG. 7, a solid line denotes a result of the first preferred embodiment, and a broken line denotes a result of the comparative example. Note that, this holds also in each of FIG. 8, FIG. 11, FIG. 12, and FIG. 14 described later.

As illustrated in FIG. 5 and FIG. 6, in the series arm resonator of the comparative example, a ripple occurs in the vicinity of 1920 MHz located in a stop band on a higher side of a first pass band of the first band pass filter. As illustrated in FIG. 7, it is understood that, due to influence of the ripple, a ripple occurs in a second pass band of a second band pass filter of the comparative example, and an insertion loss is deteriorated. Thus, there is a particularly large influence of a ripple occurring in the series arm resonator disposed on the side closest to the antenna terminal on another band pass filter connected in common with the first band pass filter.

On the other hand, in the first preferred embodiment, in the series arm resonator, in the first band pass filter, connected on the side closest to the antenna terminal, a pitch of at least some electrode fingers in the IDT electrode is different from a pitch of other electrode fingers. As a result, as illustrated in FIG. 5 and FIG. 6, it is possible to reduce or prevent the influence by dispersing the ripple in the stop band on the higher side of the first pass band. Thus, as illustrated in FIG. 7, it is possible to reduce or prevent the deterioration in insertion loss in the second pass band of the second band pass filter.

Figure 8:
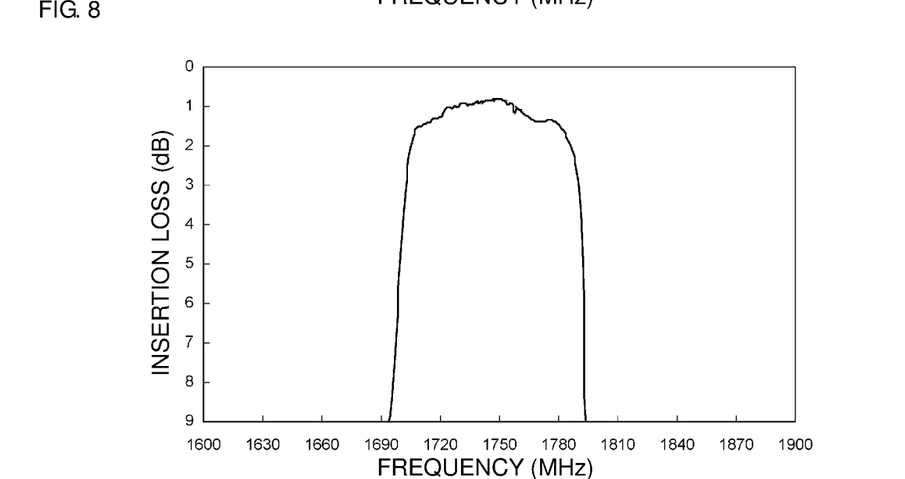
FIG. 8 is a graph illustrating attenuation frequency characteristics of the first band pass filter in the first preferred embodiment and the comparative example.

FIG. 8 is a graph illustrating attenuation frequency characteristics of the first band pass filter in the first preferred embodiment and the comparative example.

As illustrated in FIG. 8, in the first pass band, the attenuation frequency characteristics of the first preferred embodiment are substantially the same as the attenuation frequency characteristics of the comparative example, and it is understood that the deterioration in insertion loss of the first band pass filter hardly occurs. As illustrated in FIG. 5, in the first preferred embodiment, the ripple occurs at a resonant frequency of the above series arm resonator, but it is understood that this influence is extremely small.

Figure 9:
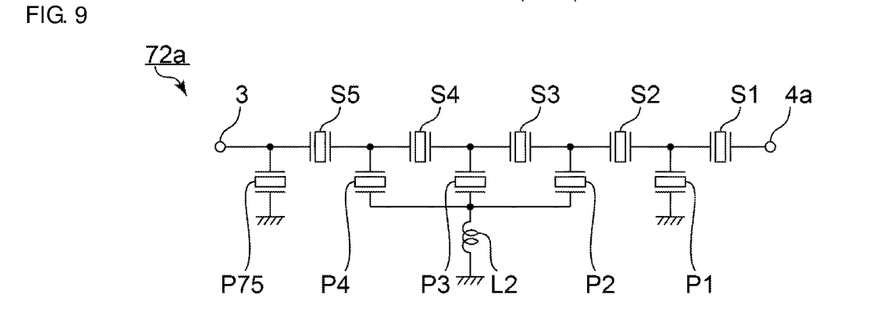
FIG. 9 is a circuit diagram of a first band pass filter in a modification of the first preferred embodiment of the present invention.

In the first preferred embodiment, all of the parallel arm resonators P1 to P4 are preferably disposed on a side closer to the first signal terminal 4a than the series arm resonator S5. On the other hand, in a modification of the first preferred embodiment illustrated in FIG. 9, a first band pass filter 72a has a parallel arm resonator P75 connected between the ground potential and a node between the antenna terminal 3 and the series arm resonator S5. In this way, the parallel arm resonator P75 may be disposed on the side closer to the antenna terminal 3 than the series arm resonator S5.

As described above, the first and second pass bands are not particularly limited. However, when the influence of the ripple occurring in the stop band on the higher side of the first pass band of the first band pass filter is large in the second pass band, preferred embodiments of the present invention can be applied particularly suitably.

Figure 10:
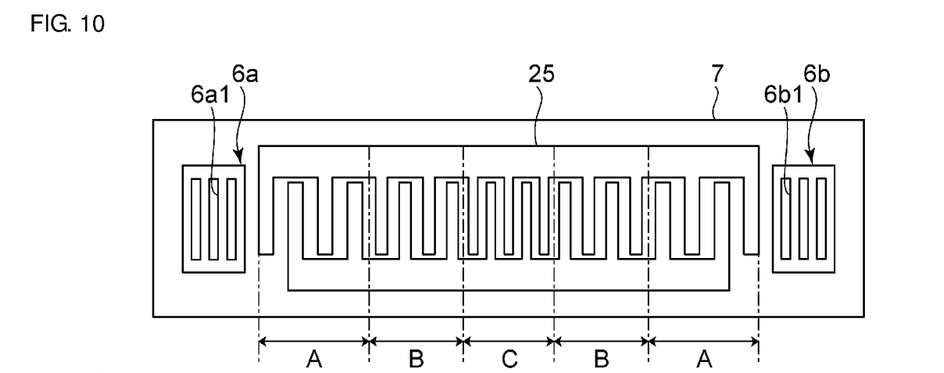
FIG. 10 is a schematic plan view illustrating an electrode configuration of a series arm resonator, in a first band pass filter, disposed on a side closest to an antenna terminal in a second preferred embodiment of the present invention.

FIG. 10 is a schematic plan view illustrating an electrode configuration of a series arm resonator, in a first band pass filter, disposed on a side closest to an antenna terminal in a second preferred embodiment of the present invention.

An acoustic wave filter device according to the second preferred embodiment is different in that an IDT electrode 25 of the series arm resonator, in the first band pass filter, disposed on the side closest to the antenna terminal includes first to third regions A to C. Except for the above, the acoustic wave filter device in the second preferred embodiment preferably has the same configuration as that of the acoustic wave filter device 1 according to the first preferred embodiment.

The first region A is a region located at an outermost side in the IDT electrode 25 in the acoustic wave propagation direction. The IDT electrode 25 includes two first regions A, that is, the first region A including one end portion and the first region A including another end portion in the acoustic wave propagation direction. The second region B is a region located inside the first region A in the acoustic wave propagation direction, and adjacent to the first region A. The IDT electrode 25 has two second regions B. The third region C is a region located innermost in the acoustic wave propagation direction, and sandwiched between the two second regions B.

Preferred pitches of electrode fingers in the IDT electrode 25 are about 1.072 μm in the first regions A, about 1.071 μm in the second regions B, and about 1.07 μm in the third region C, respectively, for example. In the first regions A, the pitch of electrode fingers is constant. Similarly, the pitches of electrode fingers are also constant in the second regions B and in the third region C, respectively. In addition, in the present preferred embodiment, duty of the IDT electrode 25 is constant.

Figure 11:
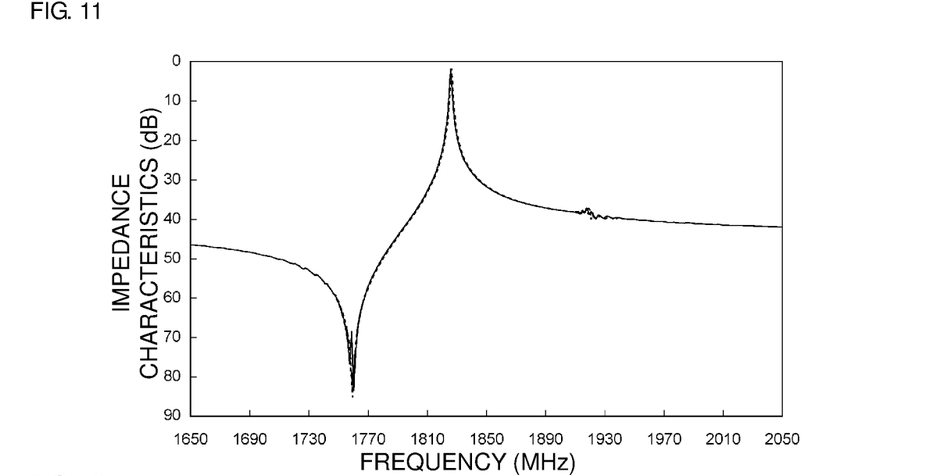
FIG. 11 is a graph illustrating impedance frequency characteristics of the series arm resonator, in the first band pass filter, disposed on the side closest to the antenna terminal in the first and second preferred embodiments and the comparative example of the present invention.
Figure 12:
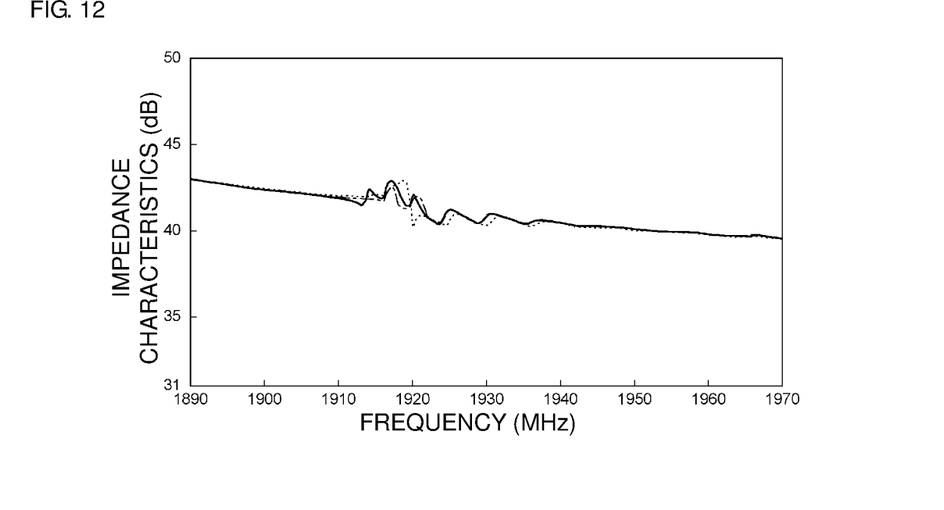
FIG. 12 is an enlarged view of a portion of FIG. 11.

In this way, it is preferable that the regions can be provided such that they each have a constant pitch of electrode fingers, and the pitches of electrode fingers among the regions can be different from each other. In this case, it is possible to further reduce or prevent a ripple of a stop band on a higher side of a first pass band of a first band pass filter, and to further reduce or prevent deterioration in insertion loss of a second band pass filter connected in common with the first band pass filter. This is illustrated in FIG. 11 and FIG. 12 below. Note that, FIG. 11 and FIG. 12 also illustrate the results of the first preferred embodiment and the comparative example.

FIG. 11 is a graph illustrating impedance frequency characteristics of the series arm resonator, in the first band pass filter, disposed on the side closest to the antenna terminal in the first and second preferred embodiments and the comparative example. FIG. 12 is an enlarged view of FIG. 11. In each of FIG. 11 and FIG. 12, a dashed-dotted line denotes a result of the second preferred embodiment.

As illustrated in FIG. 11 and FIG. 12, in the second preferred embodiment, it is possible to further suppress the ripple in the stop band on the higher side of the first pass band. Accordingly, it is possible to further reduce or prevent deterioration in insertion loss in a pass band of the second band pass filter.

Figure 13:
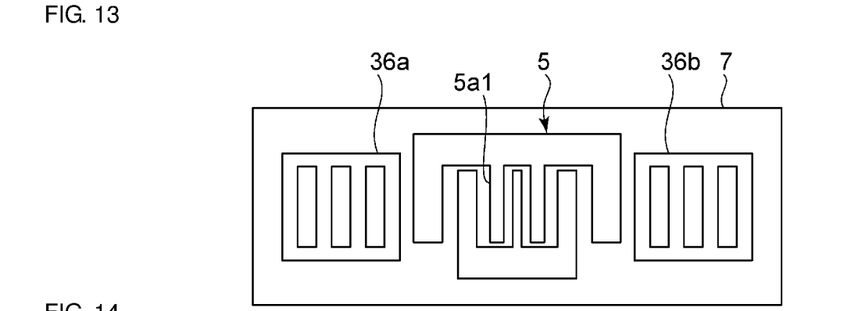
FIG. 13 is a schematic plan view illustrating an electrode configuration of a series arm resonator, in a first band pass filter, disposed on a side closest to an antenna terminal in a third preferred embodiment of the present invention.

FIG. 13 is a schematic plan view illustrating an electrode configuration of a series arm resonator, in a first band pass filter, disposed on a side closest to an antenna terminal in a third preferred embodiment of the present invention.

An acoustic wave filter device according to the third preferred embodiment is preferably different in that respective pitches of electrode fingers in reflectors 36a and 36b in a series arm resonator, in a first band pass filter, disposed on a side closest to an antenna terminal are larger than an average value of pitches of electrode fingers in the IDT electrode 5. Except for the above, the acoustic wave filter device in the third preferred embodiment has the same configuration as that of the acoustic wave filter device 1 according to the first preferred embodiment.

Figure 14:
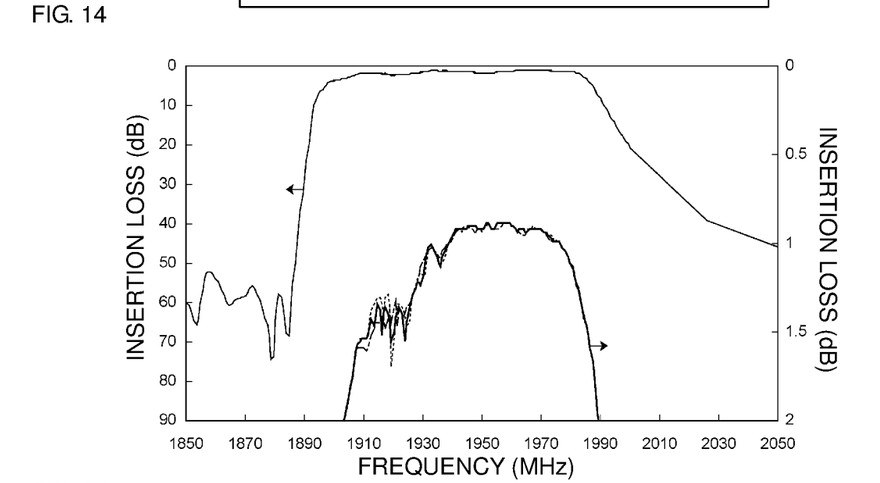
FIG. 14 is a graph illustrating attenuation frequency characteristics of the second band pass filter in the first and third preferred embodiments and the comparative example.

More specifically, the preferred pitch of electrode fingers in the reflectors 36a and 36b is about 1.079 μm, and larger than about 1.071 μm, for example, which is the average value of the pitches of electrode fingers in the IDT electrode 5. As described above, in the present preferred embodiment, a pitch of at least some electrode fingers is different from a pitch of other electrode fingers in the IDT electrode 5, and the pitch of electrode fingers in the reflectors 36a and 36b is different from the average value of the pitches of electrode fingers in the IDT electrode 5. Thus, it is possible to further suppress a ripple of a stop band on a higher side of a first pass band of the first band pass filter, and to further reduce or prevent deterioration in insertion loss of a second band pass filter connected in common with the first band pass filter. This is illustrated in FIG. 14 below. Note that, FIG. 14 also illustrates the results of the first preferred embodiment and the comparative example.

FIG. 14 is a graph illustrating attenuation frequency characteristics of the second band pass filter in the first and third preferred embodiments and the comparative example. In FIG. 14, a dashed-dotted line illustrates a result of the third preferred embodiment.

As illustrated in FIG. 14, it is understood that in the third preferred embodiment, the deterioration in insertion loss in the second band pass filter is able to be further reduced or prevented.

Figure 15:
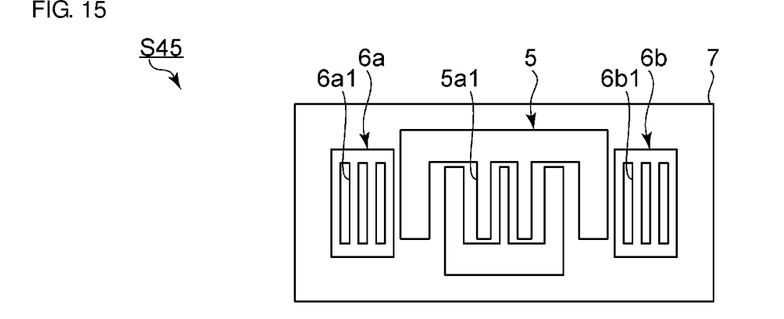
FIG. 15 is a schematic plan view illustrating an electrode configuration of a series arm resonator, in a first band pass filter, disposed on a side closest to an antenna terminal in a fourth preferred embodiment of the present invention.

FIG. 15 is a schematic plan view illustrating an electrode configuration of a series arm resonator, in a first band pass filter, disposed on a side closest to an antenna terminal according to a fourth preferred embodiment of the present invention.

An acoustic wave filter device according to the fourth preferred embodiment is preferably different from that of the first preferred embodiment in distance between the IDT electrode 5 and the reflector 6a and distance between the IDT electrode 5 and the reflector 6b, in a series arm resonator S45, in the first band pass filter, disposed on the side closest to the antenna terminal. Except for the above, the acoustic wave filter device in the fourth preferred embodiment preferably has the same configuration as that of the acoustic wave filter device 1 according to the first preferred embodiment.

As described above, in the first preferred embodiment, the distance between the IDT electrode 5 and the reflector 6a and the distance between the IDT electrode 5 and the reflector 6b are the same as the average value of the pitches of electrode fingers in the IDT electrode 5. On the other hand, in the present preferred embodiment, the distance between the IDT electrode 5 and the reflector 6a and the distance between the IDT electrode 5 and the reflector 6b are preferably about 0.47 times the average value of the pitches of electrode fingers in the IDT electrode 5.

In the present preferred embodiment, a pitch of at least some electrode fingers is different from a pitch of other electrode fingers in the IDT electrode 5, and the distance between the IDT electrode 5 and the reflector 6a and the distance between the IDT electrode 5 and the reflector 6b are preferably smaller than about 0.5 times the average value of the pitches of electrode fingers in the IDT electrode 5, for example. Thus, it is possible to further suppress a ripple of a stop band on a higher side of a first pass band of the first band pass filter, and to further reduce or prevent deterioration in insertion loss of a second band pass filter connected in common with the first band pass filter. This is illustrated in FIG. 16 below.

Figure 16:
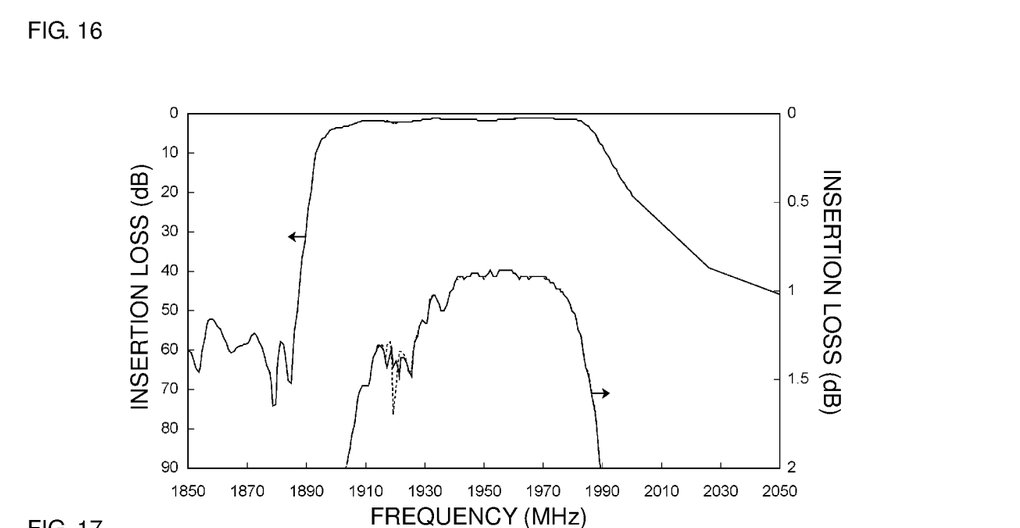
FIG. 16 is a graph illustrating attenuation frequency characteristics of a second band pass filter in the fourth preferred embodiment and the comparative example.

FIG. 16 is a graph illustrating attenuation frequency characteristics of the second band pass filter in the fourth preferred embodiment and the comparative example. In FIG. 14, a solid line denotes a result of the fourth preferred embodiment, and a broken line denotes the result of the above-described comparative example.

As illustrated in FIG. 16, it is understood that in the fourth preferred embodiment, the deterioration in insertion loss of the second band pass filter is able to be reduced or prevented.

Note that, it is preferable that the distance between the IDT electrode 5 and the reflector 6a and the distance between the IDT electrode 5 and the reflector 6b be equal to or larger than about 0.45λ, for example. In this case, it is possible to easily provide the series arm resonator S45.

In the first to fourth preferred embodiments of the present invention, in the IDT electrode, the pitch of electrode fingers in the region outside in the acoustic wave propagation direction is preferably larger than the pitch of electrode fingers in the region on the central side in the acoustic wave propagation direction, but a preferred embodiment in which pitches of electrode fingers are different is not limited thereto. For example, the pitch of electrode fingers in the region outside in the acoustic wave propagation direction may be smaller than the pitch of electrode fingers in the region on the central side in the acoustic wave propagation direction.

In the first to fourth preferred embodiments, in the IDT electrode, a pitch of at least some electrode fingers is different from a pitch of other electrode fingers, but in the reflector, a pitch of at least some electrode fingers may be different from a pitch of other electrode fingers. An example of this will be described below.

Figure 17:
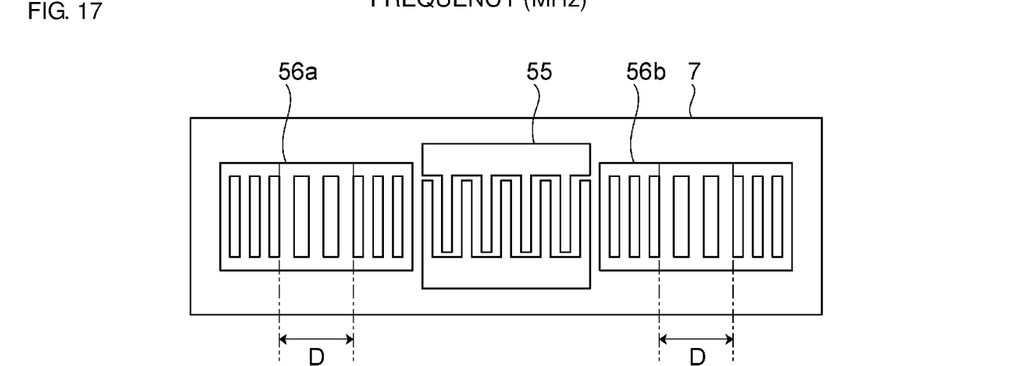
FIG. 17 is a schematic plan view illustrating an electrode configuration of a series arm resonator, in a first band pass filter, disposed on a side closest to an antenna terminal in a fifth preferred embodiment of the present invention.

FIG. 17 is a schematic plan view illustrating an electrode configuration of a series arm resonator, in a first band pass filter, disposed on a side closest to an antenna terminal according to a fifth preferred embodiment.

In an acoustic wave filter device according to the fifth preferred embodiment, a pitch of electrode fingers is preferably constant in an IDT electrode 55 within the series arm resonator, in the first band pass filter, disposed on the side closest to the antenna terminal. Each of reflectors 56a and 56b in the above series arm resonator has a region D, and a pitch of electrode fingers in the region D is different from a pitch of electrode fingers in other regions. In these respects, the acoustic wave filter device in the fifth preferred embodiment is different from that in the first preferred embodiment. Except for the above, the acoustic wave filter device in the fifth preferred embodiment has the same configuration as that of the acoustic wave filter device 1 according to the first preferred embodiment.

In the present preferred embodiment, a wave length defined by the pitch of electrode fingers in the IDT electrode 55 is preferably about 2.142 µm, for example. A wave length defined by the pitch of electrode fingers in the region D in the reflectors 56a and 56b is preferably about 2.174 µm, and a wave length defined by the pitch of electrode fingers in the other regions is preferably about 2.142 µm, for example. Note that, although illustrated schematically in FIG. 17, the reflector 56a includes 21 electrode fingers, and the region D is located at a portion including seven electrode fingers at a center in the acoustic wave propagation direction. The reflector 56b has the same configuration as that of the reflector 56a.

As described above, in the present preferred embodiment, the pitch of electrode fingers is constant in the IDT electrode 55, and a pitch of at least some electrode fingers in the reflectors 56a and 56b is different from a pitch of electrode fingers in other regions. Also in this case, it is possible to suppress a ripple of a stop band on a higher side of a first pass band of the first band pass filter, and to reduce or prevent deterioration in insertion loss of a second band pass filter connected in common with the first band pass filter. This is illustrated in FIG. 18 below.

Figure 18:
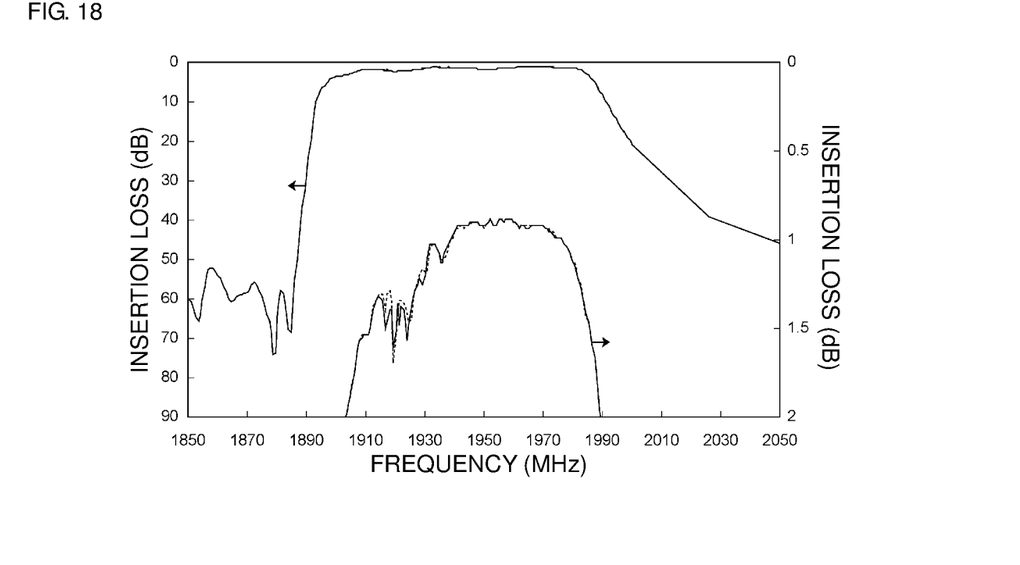
FIG. 18 is a graph illustrating attenuation frequency characteristics of a second band pass filter in the fifth preferred embodiment and the comparative example.

FIG. 18 is a graph illustrating attenuation frequency characteristics of the second band pass filter in the fifth preferred embodiment and the comparative example. In FIG. 18, a solid line denotes a result of the fifth preferred embodiment, and a broken line denotes the result of the above-described comparative example.

As illustrated in FIG. 18, it is understood that also in the fifth preferred embodiment, the deterioration in insertion loss in the second band pass filter is able to be reduced or prevented.

As described in the first to fifth preferred embodiments, it is sufficient that, in the first band pass filter, in at least one of the IDT electrode and the reflectors, at least a pitch of some electrode fingers is different from a pitch of other electrode fingers. Thus, the advantageous effects of preferred embodiments of the present invention described above are able to be obtained.

In the first to fifth preferred embodiments, the first band pass filter is a ladder filter, but the first band pass filter may be a band pass filter in which a first pass band is defined by a longitudinally coupled resonator acoustic wave filter. An example of this will be described below.

Figure 19:
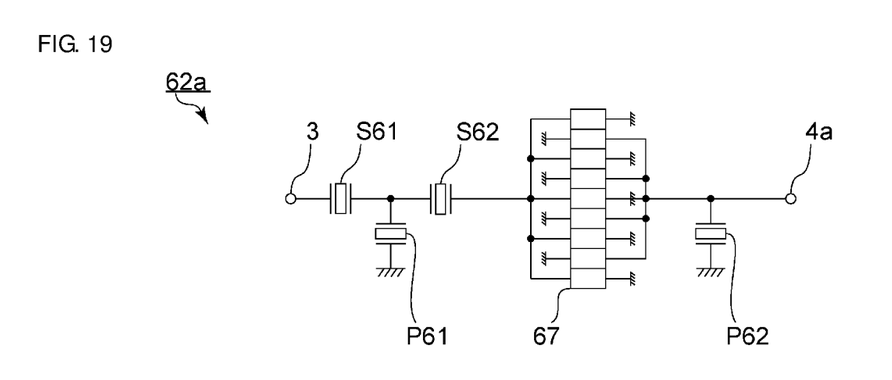
FIG. 19 is a circuit diagram of a first band pass filter in a sixth preferred embodiment of the present invention.

FIG. 19 is a circuit diagram of a first band pass filter in a sixth preferred embodiment of the present invention.

In an acoustic wave filter device according to the sixth preferred embodiment, a configuration of a first band pass filter 62a is preferably different from that in the first preferred embodiment. Except for the above, the acoustic wave filter device in the sixth preferred embodiment preferably has the same configuration as that of the acoustic wave filter device 1 according to the first preferred embodiment.

The first band pass filter 62a preferably includes a longitudinally coupled resonator acoustic wave filter 67 connected between the antenna terminal 3 and the first signal terminal 4a. A first pass band of the first band pass filter 62a is defined by the longitudinally coupled resonator acoustic wave filter 67. Acoustic wave resonators S61 and S62 are connected with each other in series between the longitudinally coupled resonator acoustic wave filter 67 and the antenna terminal 3. An acoustic wave resonator P61 is connected between the ground potential and a node between the acoustic wave resonator S61 and the acoustic wave resonator S62. An acoustic wave resonator P62 is connected between the ground potential and a node between the longitudinally coupled resonator acoustic wave filter 67 and the first signal terminal 4a.

In the present preferred embodiment, the acoustic wave resonators S61 and S62 are the first acoustic wave resonators of the present invention, and the acoustic wave resonators P61 and P62 are the second acoustic wave resonators of the present invention. The acoustic wave resonator S61 is the first acoustic wave resonator disposed on a side closest to the antenna terminal 3. The acoustic wave resonator S61 preferably has the same configuration as that of the series arm resonator S5 in the first preferred embodiment. Thus, it is possible to reduce a ripple of a stop band on a higher side of a first pass band of the first band pass filter 62a, and to reduce or prevent deterioration in insertion loss of a second band pass filter connected in common with the first band pass filter 62a.

Note that, it is sufficient that the first band pass filter 62a preferably includes at least one first acoustic wave resonator. The first band pass filter 62a does not necessarily have a second acoustic wave resonator.

In the first to sixth preferred embodiments, examples are described in which the acoustic wave filter device is a quadplexer having the first to fourth band pass filters, but the acoustic wave filter device may be a multiplexer other than the quadplexer. In addition, it is sufficient the acoustic wave filter device according to the present invention has at least the above first band pass filter and a second band pass filter in which a second pass band is in a higher side of the first pass band.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An acoustic wave filter device, comprising:
   an antenna terminal connected with an antenna;
   a first signal terminal electrically connected with the antenna terminal;
   a second signal terminal electrically connected with the antenna terminal;
   a first band pass filter connected between the antenna terminal and the first signal terminal, including at least one first acoustic wave resonator and at least one third acoustic wave resonator, and having a first pass band; and
   a second band pass filter connected between the antenna terminal and the second signal terminal, and having a second pass band on a higher side of the first pass band; wherein
   the first band pass filter includes a substrate, at least a portion of which has piezoelectricity;
   each of the at least one first acoustic wave resonator and the at least one third acoustic wave resonator includes an InterDigital Transducer (IDT) electrode provided on the substrate and reflectors disposed on both sides of the IDT electrode in an acoustic wave propagation direction;
   in each of the at least one first acoustic wave resonator and the at least one third acoustic wave resonator, each of the IDT electrode and the reflectors includes a plurality of electrode fingers;
   a pitch of at least two of the plurality of electrode fingers in at least one of the IDT electrode and the reflectors of one of the at least one first acoustic wave resonator that is disposed on a side closest to the antenna terminal is different from a pitch of others of the plurality of electrode fingers in the at least one of the IDT electrode and the reflectors of the first acoustic wave resonator disposed on the side closest to the antenna terminal; and
   a pitch of the plurality of electrode fingers in the IDT electrode of at least one of the at least one third acoustic resonator is constant or substantially constant.

2. The acoustic wave filter device according to claim 1, wherein the IDT electrode of the first acoustic wave resonator disposed on the side closest to the antenna terminal includes the pitch of the at least two of the plurality of electrode fingers that is different from the pitch of the others of the plurality of electrode fingers.

3. The acoustic wave filter device according to claim 2, wherein a pitch of the plurality of electrode fingers in the reflectors of the first acoustic wave resonator disposed on the side closest to the antenna terminal is different from an average value of pitches of the plurality of electrode fingers in the IDT electrode of the first acoustic wave resonator disposed on the side closest to the antenna terminal.

4. The acoustic wave filter device according to claim 1, wherein at least one of the reflectors of the first acoustic wave resonator disposed on the side closest to the antenna terminal includes the pitch of the at least two of the plurality of electrode fingers that is different from the pitch of the others of the plurality of electrode fingers.

5. The acoustic wave filter device according to claim 1, wherein a distance between the IDT electrode and at least one of the reflectors of the first acoustic wave resonator disposed on the side closest to the antenna terminal is shorter than about 0.5 times an average value of wave lengths defined by pitches of the plurality of electrode fingers in the IDT electrode of the first acoustic wave resonator disposed on the side closest to the antenna terminal.

6. The acoustic wave filter device according to claim 1, wherein
the first band pass filter includes a second acoustic wave resonator connected between a ground potential and a series arm connecting the antenna terminal and the first signal terminal; and
the second acoustic wave resonator is disposed on a side closer to the first signal terminal than the first acoustic wave resonator disposed on the side closest to the antenna terminal.

7. The acoustic wave filter device according to claim 6, wherein the first band pass filter is a ladder filter, the first acoustic wave resonator is a series arm resonator, and the second acoustic wave resonator is a parallel arm resonator.

8. The acoustic wave filter device according to claim 7, further comprising an inductor connected between the parallel arm resonator and a ground potential.

9. The acoustic wave filter device according to claim 1, wherein the first band pass filter further includes a longitudinally coupled resonator acoustic wave filter connected between the antenna terminal and the first signal terminal, and the first pass band is defined by the longitudinally coupled resonator acoustic wave filter.

10. The acoustic wave filter device according to claim 1, further comprising at least one additional band pass filter, other than the first and second band pass filters, connected with the antenna terminal.

11. The acoustic wave filter device according to claim 1, wherein the first band pass filter has a pass band which is equal to or higher than about 1710 MHz and equal to or lower than about 1785 MHz.

12. The acoustic wave filter device according to claim 1, wherein
the first band pass filter includes a second acoustic wave resonator connected between a ground potential and a series arm connecting the antenna terminal and the first signal terminal; and
the second acoustic wave resonator is disposed on a side closer to the antenna terminal than the first acoustic wave resonator disposed on the side closest to the antenna terminal.

13. The acoustic wave filter device according to claim 1, further comprising:
a third band pass filter and a fourth band pass filter; wherein
the first band pass filter has a transmission pass band which is equal to or higher than about 1710 MHz and equal to or lower than about 1785 MHz;
the second band pass filter has a transmission pass band which is equal to or higher than about 1920 MHz and equal to or lower than about 1980 MHz;
the third band pass filter has a reception pass band which is equal to or higher than about 1805 MHz and equal to or lower than about 1880 MHz; and
the fourth band pass filter has a reception pass band which is equal to or higher than about 2110 MHz and equal to or lower than about 2170 MHz.

14. The acoustic wave filter device according to claim 1, wherein the substrate is defined by a support substrate including a low acoustic velocity film and a piezoelectric thin film provided on a surface of the support substrate.

15. The acoustic wave filter device according to claim 14, wherein a duty ratio of the plurality of electrode fingers in the reflectors of the at least one first acoustic wave resonator is constant.

16. The acoustic wave filter device according to claim 14, wherein
the support substrate is made of Si;
the piezoelectric thin film is made of $LiTaO_3$ having a cut angle of about 50°; and
the low acoustic velocity film is made of silicon oxide.

17. The acoustic wave filter device according to claim 14, wherein pitches of the plurality of electrode fingers in the IDT electrode of the at least one first acoustic wave resonator range from about 1.07 μm to about 1.072 μm.

18. The acoustic wave filter device according to claim 1, further comprising:
a third band pass filter and a fourth band pass filter; wherein
the third band pass filter is provided on the substrate together with the first band pass filer; and
the second pass filter is provided on an additional substrate together with the second band pass filer.

19. An acoustic wave filter device, comprising:
an antenna terminal connected with an antenna;
a first signal terminal electrically connected with the antenna terminal;
a second signal terminal electrically connected with the antenna terminal;
a first band pass filter including at least one first acoustic wave resonator connected between the antenna terminal and the first signal terminal, and having a first pass band; and
a second band pass filter connected between the antenna terminal and the second signal terminal, and having a second pass band on a higher side of the first pass band; wherein
the first band pass filter includes a substrate, at least a portion of which has piezoelectricity;
the at least one first acoustic wave resonator includes an InterDigital Transducer (IDT) electrode provided on the substrate and reflectors disposed on both sides of the IDT electrode in an acoustic wave propagation direction;
each of the IDT electrode and the reflectors of the at least one first acoustic wave resonator includes a plurality of electrode fingers;
a pitch of at least two of the plurality of electrode fingers in at least one of the IDT electrode and the reflectors of one of the at least one first acoustic wave resonator that is disposed on a side closest to the antenna terminal is different from a pitch of others of the plurality of electrode fingers in the at least one of the IDT electrode and the reflectors of the first acoustic wave resonator disposed on the side closest to the antenna terminal; and
a distance between the IDT electrode and at least one of the reflectors of the first acoustic wave resonator disposed on the side closest to the antenna terminal is shorter than about 0.5 times an average value of wave lengths defined by pitches of the plurality of electrode fingers in the IDT electrode of the first acoustic wave resonator disposed on the side closest to the antenna terminal.

20. An acoustic wave filter device, comprising:
an antenna terminal connected with an antenna;
a first signal terminal electrically connected with the antenna terminal;
a second signal terminal electrically connected with the antenna terminal;
a first band pass filter including at least one first acoustic wave resonator connected between the antenna terminal and the first signal terminal, and having a first pass band; and a second band pass filter connected between the antenna terminal and the second signal terminal, and having a second pass band on a higher side of the first pass band; wherein the first band pass filter includes a substrate, at least a portion of which has piezoelectricity;

the at least one first acoustic wave resonator includes an InterDigital Transducer (IDT) electrode provided on the substrate and reflectors disposed on both sides of the IDT electrode in an acoustic wave propagation direction;

each of the IDT electrode and the reflectors of the at least one first acoustic wave resonator includes a plurality of electrode fingers;

a pitch of at least two of the plurality of electrode fingers in at least one of the IDT electrode and the reflectors of one of the at least one first acoustic wave resonator that is disposed on a side closest to the antenna terminal is different from a pitch of others of the plurality of electrode fingers in the at least one of the IDT electrode and the reflectors of the first acoustic wave resonator disposed on the side closest to the antenna terminal; and the first band pass filter further includes a longitudinally coupled resonator acoustic wave filter connected between the antenna terminal and the first signal terminal, and the first pass band is defined by the longitudinally coupled resonator acoustic wave filter.

* * * * *